United States Patent [19]
Hurtarte

[11] Patent Number: 5,487,673
[45] Date of Patent: Jan. 30, 1996

[54] PACKAGE, SOCKET, AND CONNECTOR FOR INTEGRATED CIRCUIT

[75] Inventor: Jorge S. Hurtarte, La Mirada, Calif.

[73] Assignee: Rockwell International Corporation, Seal Beach, Calif.

[21] Appl. No.: 165,608

[22] Filed: Dec. 13, 1993

[51] Int. Cl.⁶ .................................... H01R 9/09
[52] U.S. Cl. ........................... 439/69; 439/72
[58] Field of Search ................. 439/68, 69, 72, 439/79

[56] References Cited

U.S. PATENT DOCUMENTS

| 3,676,746 | 7/1972 | Kassabgi | 439/79 |
|---|---|---|---|
| 4,552,422 | 11/1985 | Bennett | 439/69 |
| 4,814,857 | 3/1989 | Werbizky | 439/68 |
| 4,971,564 | 11/1990 | Meyer | 439/70 |
| 5,079,671 | 1/1992 | Garrett et al. | 439/79 |
| 5,158,471 | 10/1992 | Fedder | 439/79 |
| 5,265,322 | 11/1993 | Fisher | 439/72 |
| 5,281,165 | 1/1994 | McCleerey | 439/79 |
| 5,327,326 | 7/1994 | Komoto et al. | 361/760 |

FOREIGN PATENT DOCUMENTS

| 52-58815 | of 0000 | Japan . | |
| 8301540 | 4/1983 | WIPO | 439/79 |

Primary Examiner—P. Austin Bradley
Assistant Examiner—James Miner
Attorney, Agent, or Firm—George A. Montanye; Charles T. Silberberg; Tom Streeter

[57] ABSTRACT

A dual in-line package 12 for an integrated circuit 10 has pins 14 which engage the holes of a complementary socket 16, having two rows 16a and 16b. A portion of one row 16b is omitted, allowing the holes 22 of a cable connector 24 to engage the corresponding pins 20 of the package 12.

3 Claims, 1 Drawing Sheet

PACKAGE, SOCKET, AND CONNECTOR FOR INTEGRATED CIRCUIT

BACKGROUND OF THE INVENTION

This invention relates to integrated circuit packaging, and has particular relation to modems in a modular, replaceable package.

Modem technology often advances faster than the technology which it supports. It therefore is desirable to retrofit existing electronic devices with new modems, or to use newly developed modems when manufacturing devices which have been in production for some time. Both activities are made easier by having a socket on the device into which the modem—replacement or newly developed—may be plugged.

A socket, however, consumes a lot of space. Space, always in short supply in electronics, is in even shorter supply here, because a space-consuming interface connector (RS232, DAA, LED, or the like) must also be mounted on the device, to be connected to the socket and, through the modem, to interface with the device.

SUMMARY OF THE INVENTION

The present invention eliminates the need for the interface connector. The modem, in a dual in-line package, has pins which engage the holes of a complementary socket. A portion of the socket is omitted, allowing the holes of an external cable connector (not an interface connector) to engage the corresponding pins of the package directly.

One of the holes of the cable connector may be filled in, and the corresponding pin of the package omitted, to assure that the cable connector is attached to the proper pins of the package. Likewise, one of the holes of the socket may be filled in, and the corresponding pin of the package omitted, to assure that the package is properly attached to the socket.

The package is particularly suited to housing a modem. It allows a cable, carrying telephone or other electronic signals and terminating in the cable connector, to mate with a motherboard mounting the socket. The portion of the motherboard opposite the pins for the cable connector is omitted, allowing access between the package and the cable connector. The packaged modem may be removed and replaced with a modem which is identically packaged, but upgraded. The identical packaging avoids the need to make any change in the cable connector, the socket, or the motherboard.

DETAILED DESCRIPTION OF THE DRAWING

Figure 1:
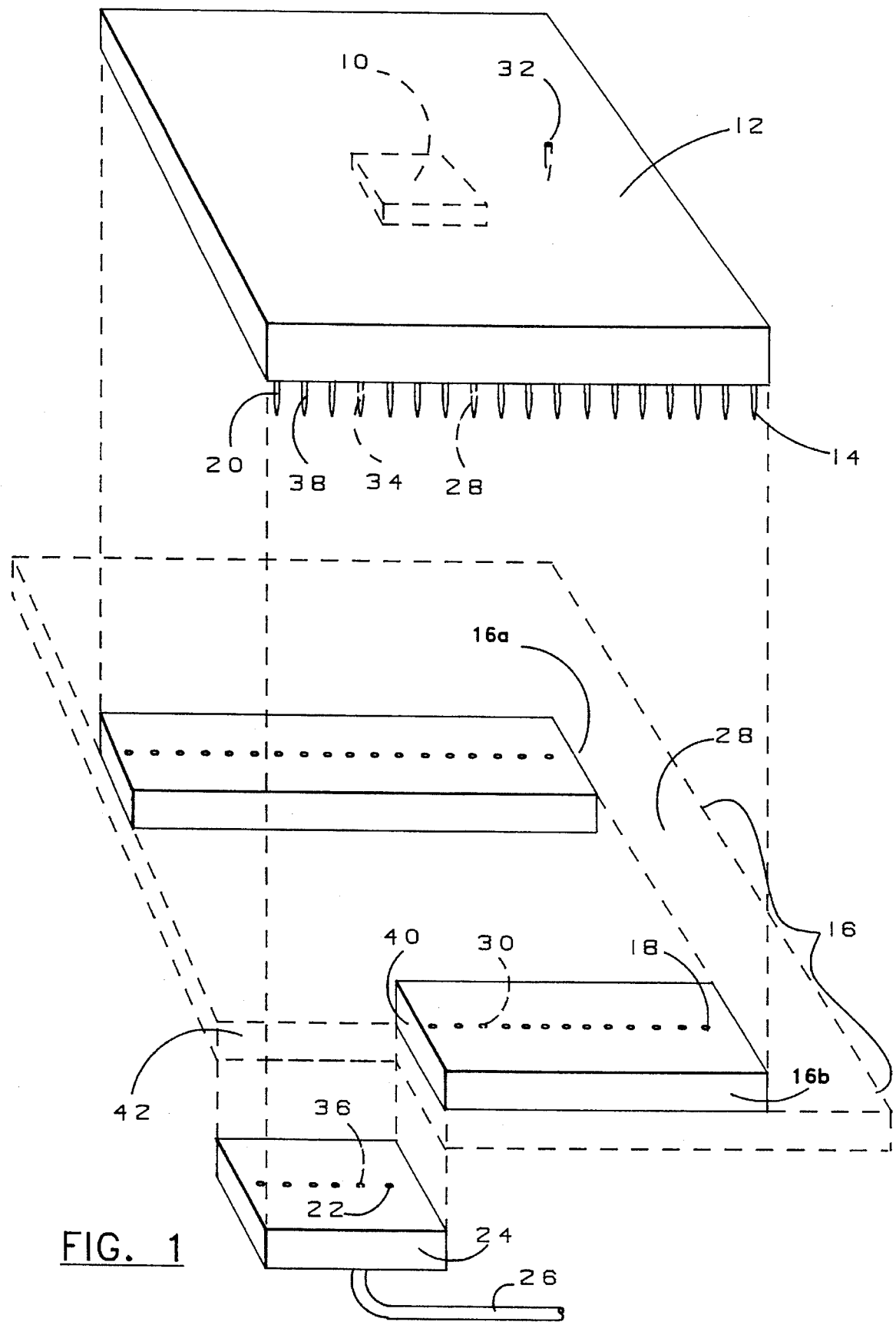
FIG. 1 is a perspective view of the modem package, socket, cable connector, cable, and motherboard.

In FIG. 1, a modem 10 is packaged in a dual in-line package 12, which includes pins 14. The package 12 and pins 14 are configured to fit onto a socket 16 with holes 18. The socket 16 generally includes two rows 16a and 16b. Not all pins 14 of the package 12 are configured to fit onto the socket 16; some pins 20 are configured to fit into the holes 22 of a cable connector 24, which is the terminus of a cable 26. When the cable connector 24 is attached to the package 12, and the package 12 is plugged into the socket 16, the cable 26 can interface with the motherboard 28, on which the socket 16 is mounted, through the modem 10. In this way, a conventional interface connector is entirely eliminated, and the space which would have been devoted to it may be redirected to more productive uses.

A dual in-line package is subject to being inverted, such that each line of pins is improperly placed into the line of holes meant for the other line of pins. This is avoided in the present invention by omitting one pin 28 and its corresponding socket hole 30. If the package 12 is inverted, the corresponding pin 32 on the other line of pins will attempt to enter the non-existent hole 30, and the person inserting the package 12 into the socket 16 will be alerted to his or her error. Likewise, a pin 34 and its corresponding connector hole 36 are omitted so that an inversion of the cable connector 24 will cause corresponding pin 38 to attempt to enter the non-existent hole 36. Either or both of these reliability interlocks may be omitted if pin count is important and assembly skills are adequate.

The socket 16 is shown with a shortened end 40 to one of its rows 16b, the end 40 thereby defining a space into which the cable connector 24 may be placed when it plugs onto the package 12. This configuration is preferred, but any configuration which exposes some of the pins 20 for the holes 22 of the cable connector 24, while the remainder of the pins are inserted into the holes 18 of the socket 16, is suitable.

The socket 16 is mounted on a motherboard 28. Regardless of how the package 12 and socket 16 are configured to make room for the cable connector 24, the motherboard 28 must include means for allowing access between the package 12 and cable connector 24. Walls 42 defining a cut out corner of the motherboard 28 are preferred. If necessary, the cut-out can be made from the edge of the motherboard 28, or even from its interior, rather than from its corner.

While a particular embodiment of the present invention has been described in some detail, the true scope and spirit of the present invention are not limited thereto, but are limited only by the appended claims and their equivalents.

What is claimed is:

1. A combination comprising:
   (a) a package containing an integrated circuit, the package including a plurality of pins;
   (b) a socket which includes means defining a plurality of holes, some of which are situated to engaged complementary pins of the package;
   (c) a cable connector which includes means defining a plurality of holes, some of which are situated to engaged complementary pins of the package, different from the pins situated to engage the holes of the socket;
   (d) a motherboard mounting the socket; and
   (e) means defining a hole in the motherboard opposite the pins complementary to the cable connector.

2. The combination of claim 1, wherein the integrated circuit comprises a modem.

3. The combination of claim 2, further comprising a cable attached to the cable connector.

* * * * *